United States Patent [19]

Onuki et al.

[11] Patent Number: 4,500,904

[45] Date of Patent: Feb. 19, 1985

[54] SEMICONDUCTOR DEVICE

[75] Inventors: Jin Onuki; Ko Soeno; Keiichi Morita; Hisakithi Onodera, all of Hitachi, Japan

[73] Assignee: Hitachi, Ltd., Tokyo, Japan

[21] Appl. No.: 544,119

[22] Filed: Oct. 20, 1983

Related U.S. Application Data

[63] Continuation of Ser. No. 211,121, Nov. 28, 1980, abandoned.

[30] Foreign Application Priority Data

Nov. 30, 1979 [JP] Japan ................................ 54-154450

[51] Int. Cl.[3] ............................................ H01L 23/48

[52] U.S. Cl. ........................................ 357/67; 357/71

[58] Field of Search .................................. 357/67, 71

[56] References Cited

U.S. PATENT DOCUMENTS

| | | | |
|---|---|---|---|
| 3,341,753 | 9/1967 | Cunningham | 357/71 |
| 3,368,124 | 2/1968 | Ditrick | 357/71 |
| 3,445,301 | 5/1969 | Topar | 357/71 |
| 3,609,470 | 9/1971 | Kurpa | 357/71 |
| 3,737,340 | 6/1973 | Maeda et al. | 357/71 |

*Primary Examiner*—Martin H. Edlow

*Attorney, Agent, or Firm*—Antonelli, Terry & Wands

[57] ABSTRACT

A solder joint between a semiconductor substrate and an electrode is disclosed in which that principal surface of the semiconductor substrate where an n-type semiconductor layer is exposed is bonded to the electrode with brazing solder, and the brazing solder includes aluminum solder provided on the side of the semiconductor substrate and copper solder provided on the side of the electrode. Since solid phase adhesion can be achieved between aluminum and copper even at temperatures below an eutectic temperature of 548° C., the semiconductor substrate can be soldered to the electrode at the low temperatures.

15 Claims, 4 Drawing Figures

SEMICONDUCTOR DEVICE

This is a continuation of pending prior application Ser. No. 211,121, filed Nov. 28, 1980 now abandoned.

BACKGROUND OF THE INVENTION

The present invention relates to a semiconductor device, and more particularly to a bonding structure between a semiconductor substrate and a supporting electrode made of molybdenum, tungsten, or the like.

Aluminum solder (containing only aluminum or aluminum as its main component) is frequently employed to bond a semiconductor substrate to an electrode for supporting the semiconductor substrate and for supplying an electric current to the substrate. Further, in some cases, silicon substrates are bonded to each other with the aluminum solder. The reason why aluminum is employed as the brazing solder in the above-mentioned cases is that aluminum is superior to any other brazing solder in electrical conduction and adhesive properties. Also aluminum solder is a hard solder and is inexpensive.

However, when the surface of the silicon substrate which is to be soldered has an n-type conductivity portion, difficulties arise in that aluminum is alloyed with silicon by the heat of the bonding operation. Therefore, a layer having a p-type conductivity is formed in the n-type portion of the surface, and the forward voltage drop (hereinafter referred to as an FVD) of the silicon substrate is increased.

In order to suppress the formation of such a p-type layer in the n-type layer, methods have been employed such as making the aluminum solder thin, interposing between the silicon substrate and the aluminum solder a foil made of antimony which is a pentavalent element, or diffusing a large amount of phosphorus into the n-type portion of the surface. However, such methods have been carried out without any marked effect.

Further, the silicon substrate and the electrode have to be heated to a high temperature during soldering after impurities for determining the conductivity type have already been diffused into the silicon substrate. Accordingly, the distribution of the impurities in the silicon substrate is changed, and a heavy metal which acts as a lifetime killer in the silicon substrate is diffused therein. Thus the silicon substrate is adversely affected by the bonding operation.

SUMMARY OF THE INVENTION

An object of the present invention is to provide a semiconductor device in which a semiconductor substrate can be bonded to an electrode with aluminum solder at low temperatures in order not to increase an FVD of the semiconductor substrate.

Another object of the present invention is to provide a semiconductor device in which a semiconductor substrate can be bonded firmly to an electrode with aluminum solder.

A further object of the present invention is to provide a semiconductor device in which a semiconductor substrate can be bonded to an electrode without reducing a breakdown voltage of the semiconductor substrate.

According to the present invention which attains these and other objects, there is provided a semiconductor device in which aluminum solder is provided on the side of a semiconductor substrate, copper solder is provided on the side of an electrode, and the semiconductor substrate is bonded to the electrode with the aluminum and copper solders. The semiconductor substrate is made of such well-known materials as silicon or germanium. The electrode is made of a metal which is nearly the same as the semiconductor substrate in its coefficient of thermal expansion, for example, molybdenum, tungsten, an alloy of iron and nickel, an alloy of iron, nickel and cobalt, or a composite material in which carbon fibres are buried in a copper matrix.

The present invention is based upon the thought that, in a case where only a very small amount of silicon melts into aluminum by reducing the bonding temperature, the degree of formation of the p-type layer in an n-type layer is reduced. Therefore, the increase in the FVD of the silicon substrate is slight.

DESCRIPTION OF THE PREFERRED EMBODIMENTS

Figure 1:
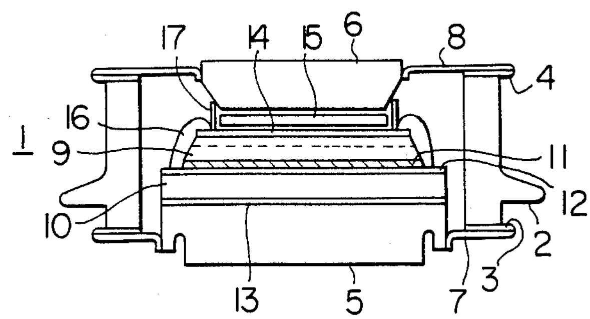
FIG. 1 is a longitudinal sectional view showing an embodiment of a disk type diode according to the present invention.

Referring to FIG. 1 which shows an embodiment of a disk type diode according to the present invention, a diode 1 is divided generally into three parts, namely, a package, a semiconductor substrate incorporated in the package, and auxiliary members. The package includes a ceramic cylinder 2, flanges 3 and 4 made of an alloy of iron and nickel and bonded to both ends of the ceramic cylinder 2 with solder, copper electrodes 5 and 6 provided across the axis of the ceramic cylinder 2 at both ends thereof, and flanges 7 and 8 made of an alloy of iron and nickel and bonded to circumferential portions of the copper electrodes 5 and 6 with solder respectively.

A semiconductor substrate 9 is bonded to a supporting electrode 10 through a solder layer, which is made up of aluminum solder 11 on the side of the semiconductor substrate 9 and copper solder 12 on the side of the supporting electrode 10. The supporting electrode 10 is bonded to the copper electrode 5 with Au-Sn solder 13 or the like.

An aluminum layer 14 forming an electrode film is deposited through evaporation techniques on a top principal surface of the semiconductor substrate 9, and an internal buffer 15 made of tungsten is interposed between the aluminum layer 14 and the copper electrode 6. Solder material is not interposed between the aluminum layer 14 and the internal buffer 15 or between the internal buffer 15 and the copper electrode 6. Instead the internal buffer 15 is kept in direct contact with the aluminum layer 14 and the copper electrode 6.

In more detail, a pair of radiators (not shown) each made of aluminum are pressed against the copper electrodes 5 and 6. Owing to the pressure applied to the radiators, the flanges 7 and 8 are bent, and thus the internal buffer 15 is brought into close contact with the aluminum layer 14 and the copper electrode 6. Tungsten does not alloy with copper or aluminum at a temperature of, for example, 120° C., which is the temperature to which the diode 1 is typically heated by heat generated during its operating period.

A pn junction in the semiconductor substrate 9 is exposed to the side face thereof. In order to maintain the exposed end of the pn junction at a stable state and to improve the reliability of characteristics of the semiconductor substrate 9, the side surface of the semiconductor substrate 9 is coated with a passivation material 16 such as as silicone rubber as shown in FIG. 1.

In order to prevent the passivation material 16 from flowing and to prevent the internal buffer 15 from moving in a lateral direction, there is provided on the aluminum layer 14 an insulating cylinder 17 which is kept in contact with a beveled side face of the copper electrode 6.

The bottom principal surface portion of the semiconductor substrate 9 on which the aluminum solder 11 is provided has an n-type conductivity.

The semiconductor substrate 9 and the supporting electrode 10 are soldered, for example, in the following manner.

The bottom principal surface portion of the semiconductor substrate 9, which includes therein the pn junction, is highly doped with a donor. The aluminum solder 11 is deposited by evaporation on the bottom principal surface of the semiconductor substrate 9 so as to have a thickness of about 20 $\mu$m, and then the semiconductor substrate 9 is maintained at 400° C. for 10 minutes in $N_2$ gas to enhance the bonding strength between the aluminum solder 11 and silicon forming the semiconductor substrate 9. On the other hand, the copper solder 12 is deposited through vacuum evaporation on the supporting electrode 10 made of tungsten so as to have a thickness of 10 $\mu$m. A nickel film may be provided between the copper solder 12 and the supporting electrode 10 in order to enhance the bonding strength therebetween. When a nickel film is provided, a surface of the supporting electrode 10 is plated with nickel so that a nickel film having a thickness of about 10 $\mu$m is formed. Then the supporting electrode 10 is maintained at 750° C. for 30 minutes under vacuum conditions. Subsequently, the copper solder 12 is deposited on the nickel film, and then the supporting electrode 10 is maintained at 400° C. for 10 minutes in $N_2$ gas to enhance the bonding strength between the nickel film and tungsten forming the supporting electrode 10 and to enhance the bonding strength between the nickel film and the copper solder 12.

After the above-mentioned pretreatment has been conducted, the semiconductor substrate 9 and the supporting electrode 10 are positioned so that the aluminum solder 11 and the copper solder 12 are brought in contact with each other, and then maintained at 450° C. for 30 minutes under vaccuum conditions to be bonded.

As the bonding temperature is lower, the amount of silicon melting into aluminum is small and the degree of the formation of p-type layer in the n-type layer is small.

Figure 2:
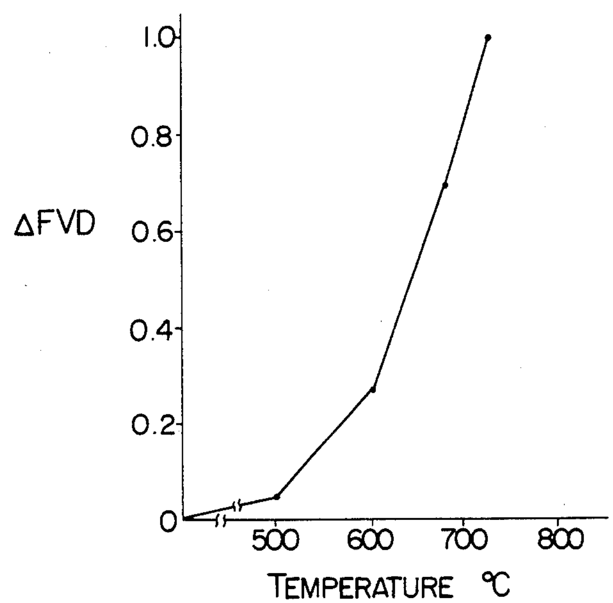
FIG. 2 is a graph for showing a relation between bonding temperatures and changes in FVD when a semiconductor substrate is bonded to a supporting electrode with aluminum solder and copper solder.

FIG. 2 shows ΔFVD (namely, changes in FVD) in a case where semiconductor substrates, each of which has a p-n-n+ structure and is provided at both surfaces thereof with evaporated aluminum layers each having a thickness of 12 to 15 $\mu$m, are maintained at various temperatures within a range from 500° to 720° C. to bond the semiconductor substrate and the aluminum layers. In more detail, ΔFVD indicates a difference between an FVD of the semiconductor substrate immediately after the aluminum layers are deposited on the semiconductor substrate and an FVD after the semiconductor substrate has been subjected to the above-mentioned heat treatment. In other words, it is an increase in FVD caused by the formation of p-type regrowth layer on an n-type layer. The results shown in FIG. 2 were obtained from measurements carried out at a current density of 3.25 MA/m$^2$. As is apparent from FIG. 2, ΔFVD depends greatly upon the bonding temperature, and is equal to 1.0 V and about 0.05 V for the semiconductor substrates maintained at 720° C. and 500° C., respectively.

Aluminum and copper form an eutectic alloy at a temperature of 548° C. However, solid phase adhesion can sufficiently take place between aluminum and copper even at temperatures below the above-mentioned eutectic temperature.

In the above embodiment, the aluminum solder 11 and the copper solder 12 adhere well to each other. Further, the increase in ΔFVD small since the semiconductor substrate 9 and the supporting electrode 10 are maintained at 450° C. to be bonded.

Incidentally, the aluminum solder 11 was analyzed after having been maintained at 450° C., and it was found that silicon melted into the aluminum solder 11 at a concentration of only several percents and that the p-type layer was scarcely formed in the bottom principal surface of the semiconductor substrate 9.

Further, a supersonic flow test was given to the solder portion including the aluminum solder 11 and the copper solder 12, and it was found that the solder 11 and the solder 12 adhered well to each other. Further, the semiconductor substrate 9 in which the aluminum layers 11 and 14 were bonded to the substrate 9 by the above-mentioned heat treatment, was the same in FVD as a semiconductor substrate which included evaporated aluminum layers but was not subjected to any heat treatment.

In a case where the nickel film is omitted from the above-mentioned embodiment, the step of forming the nickel film is omitted from the above-mentioned fabricating process. In this case, the bonding strength between the copper solder 12 and the tungsten electrode 10 is a somewhat inferior to that in the above-mentioned embodiment, but the FVD characteristic is nearly the same as that of the embodiment.

In the embodiment shown in FIG. 1, the aluminum solder 11 is provided on the bottom principal surface of the semiconductor substrate 9. However, if desired the aluminum solder 11 may be replaced by solder made of an alloy of aluminum and silicon to improve the adhesive property. When such a solder made of an alloy of aluminum and silicon is employed in place of the aluminum solder 11, a smaller amount of silicon melts into the solder during heating treatment. Therefore the formation of p-type layer in the n-type layer is suppressed to an even greater degree. Further, a ternary alloy containing aluminum, silicon and copper is formed at the interface between the copper solder and the alloy solder made of aluminum and silicon. The eutectic temperature of the ternary alloy is 520° C., and is lower than the eutectic temperature (equal to 548° C.) of the binary alloy made of aluminum and silicon. Accordingly, the semiconductor body 9 and the supporting electrode 10 can be bonded at lower temperatures as compared with the case where the aluminum solder 11 is employed. Thus, the formation of p-type layer in the n-type layer is suppressed to a greater degree, and the increase in FVD is very small.

Further, when a eutectic alloy of aluminum and silicon is employed in place of the aluminum solder 11, the above-mentioned effects are more remarkable. Moreover, the bonding strength between the semiconductor substrate 9 and the supporting electrode 10 is nearly the same as that in the case where the aluminum solder 11 is employed.

As has been explained above, the present invention is effective in a case where an n-type principal surface of a silicon substrate is bonded to an electrode made of tungsten, molybdenum, an alloy of iron and nickel, or the like. Further, the present invention is applicable to a structure in which a silicon substrate has to be bonded to an electrode at low temperatures in order to prevent the electrode from bending. It is also applicable to various semiconductor devices such as diodes, transistors and thyristors. Furthermore, the present invention is applicable to a case where a p-type layer and an n-type layer coexist in a principal surface of a silicon substrate, as well as being applicable to semiconductor devices such as those including germanium substrates.

Figure 3:
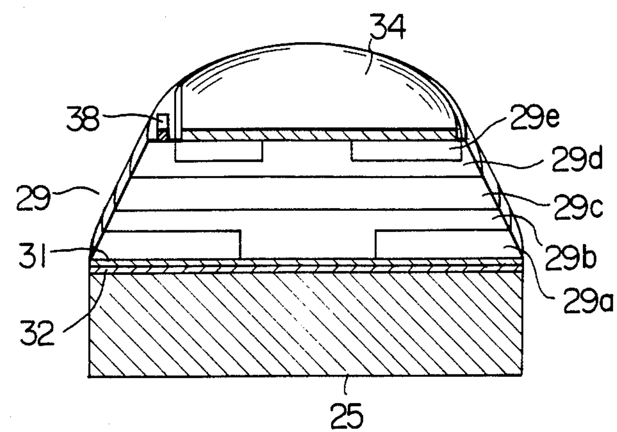
FIG. 3 is a longitudinal sectional and perspective view for showing a semiconductor substrate supporting portion of an embodiment of a reverse conducting thyristor according to the present invention.

FIG. 3 shows a case where a layer having a p-type conductivity and a layer having an n-type conductivity are included in a bottom principal surface of a semiconductor substrate 29.

The semiconductor substrate 29 shown in FIG. 3 serves as a reverse conducting thyristor, and includes a p-type emitter layer 29*a*, a heavily doped n-type base layer 29*b*, a lightly doped n-type base layer 29*c*, a p-type base layer 29*d* and an n-type emitter layer 29*e*. The semiconductor substrate 29 has the form of a truncated cone. The p-type emitter layer 29*a* is provided in the form of a ring in a bottom principal surface of the substrate 29, and the n-type emitter layer 29*e* is formed in a top principal surface of the substrate 29 in the form of a ring whose circumferential portion is cut off at a part thereof. A supporting electrode 25, which is made of a composite material including a copper matrix and carbon fibres, is bonded to the bottom principal surface of the substrate 29 in accordance with the present invention. Brazing solder for bonding the supporting eleстrode 25 and the substrate 29 includes aluminum solder 31 provided on the side of the bottom principal surface and copper solder 32 provided on the side of the supporting electrode 25. A cathode film 34 is deposited by evaporation on the top principal surface of the substrate 29, and a gate electrode film 38 is deposited by evaporation on that part of the top principal surface where the p-type base layer 29*d* is exposed in the form of a segment of a circle.

In the semiconductor substrate 29, there is formed a thyristor region and a diode region. The thyristor region includes the p-type emitter layer 29*a*, the n-type base layers 29*b* and 29*c*, the p-type base layer 29*d* and the n-type emitter layer 29*e*, and the forward direction of the thyristor is given by a direction from the bottom principal surface to the top principal surface of the substrate 29. The diode region includes the p-type base layer 29*d* and the n-type base layers 29*b* and 29*c*, and the forward direction of the diode is given by a direction from the top principal surface to the bottom principal surface of the substrate 29. In other words, the thyristor region and the diode region are juxtaposed and mechanically compounded in the semiconductor substrate 29 with their forward directions being reversed.

The supporting electrode 25 utilizes the excellent electrical and thermal conduction of the copper matrix and the small thermal expansion of the carbon fibres, and the coefficient of thermal expansion of the supporting electrode 25 can be made equal to that of the semiconductor substrate 29 by adjusting the mixing ratio between the copper matrix and the carbon fibres. The carbon fibres are distributed in the copper matrix in a retuculate, spiral, random, or other arrangement, and one of these arrangements is selected in accordance with various uses.

Now, explanation will be made for a case where the spiral arrangement is employed. Copper-plated carbon fibres are dipped into a copper slurry to make copper powders adhere to the surfaces of the fibres, and are then wound round a copper core or rod. Then, the copper core is removed to form a hollow. The thus formed hollow is filled with copper powders, and then heated while being pressed to obtain a desired composite material. The composite material thus obtained contains, for example, 50% copper and 50% carbon by volume. In this case, the carbon fibres are arranged spirally in a plane perpendicular to the axis of the core, and the supporting electrode 25 is formed so that the above-mentioned plane is exposed.

Grease is removed from the surface of the supporting electrode 25, and the electrode 25 is washed in water. Then, the electrode 25 is dipped into a 50% solution of nitric acid, and subsequently copper solder 32 having a thickness of 10 $\mu$m is deposited by electroplating on the supporting electrode 25. The copper solder 32 may be deposited by evaporation.

Next, the supporting electrode 25 is heated to a temperature of 200° to 300° C. in $H_2$ gas to make the copper solder 32 adhere firmly to the supporting electrode 25. On the other hand, aluminum solder 31 having a thickness of 15 to 20 $\mu$m is deposited by evaporation on the bottom principal surface of the semiconductor substrate 29, and then the substrate 29 is maintained at 400° C. for 10 minutes in $N_2$ gas to make the aluminum solder 31 adhere firmly to the bottom principal surface. Subsequently, the semiconductor substrate 29 and the supporting electrode 25 are set by a jig, and maintained at 520° C. for 20 minutes to bond the substrate 29 to the supporting electrode 25.

The aluminum solder 31 acts as brazing solder for the p-type emitter layer 29*a*, and acts as not only brazing solder but also an acceptor for the n-type base layer 29*b*. However, since the semiconductor substrate 29 and the supporting electrode 25 are bonded at a low temperature, the formation of p-type layer in the surface of the n-type base layer 29*b* is slight, and therefore the FVD of the substrate 29 is scarcely increased.

In order to compare the bonding strength of the aluminum and copper solder 31 and 32 with that of other solders, there was formed a sample in which solder containing lead, silver and tin was employed in place of the aluminum and copper solders 31 and 32. A thermal fatigue life test was given to the above-mentioned sample and a sample employing both aluminum solder and copper solder in accordance with the present invention. In the test, one heat cycle including a period for heating the samples from 0° to 150° C. and another period for cooling the samples from 150° to 0° C. was repeated. The thermal resistance of the sample according to the present invention was nearly equal to an initial value even after the heat cycle had been repeated 20,000 times. On the other hand, the thermal resistance of the sample employing the Pb-Ag-Sn solder was greatly increased even when the heat cycle had been repeated 10,000 times. Further, in a pressure test, the sample according to the present invention could withstand pressures up to 400 $Kg/cm^2$, while the sample employing the Pb-Ag-Sn solder could withstand a pressure of only 100 $Kg/cm^2$.

Figure 4:
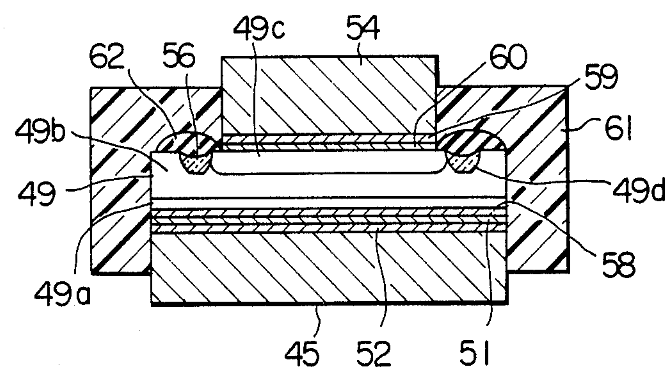
FIG. 4 is a longitudinal sectional view showing an embodiment of a plastic-mold disk-type diode according to the present invention.

FIG. 4 shows an embodiment of a plastic mold diode according to the present invention, in which top and bottom principal surfaces of a semiconductor substrate 49 are bonded to supporting electrodes.

Referring to FIG. 4, the semiconductor substrate 49 includes a heavily doped n-type layer 49*a*, a lightly doped n-type layer 49*b* and a p-type layer 49*c*, and a groove 49*d* is formed in a circumferential portion of a top principal surface of the substrate 49. A pn junction is exposed to an inside wall of the groove 49*d*, and a glass layer 56 serving as a passivation layer is baked or sintered within the groove 49. The bottom and top principal surfaces of the substrate 49 are bonded respectively to supporting electrodes 45 and 54, each of which is made of a composite material containing a copper matrix and carbon fibres as explained in connection with the embodiment shown in FIG. 3.

The bottom principal surface of the semiconductor substrate 49 is provided with a nickel film 58, on which aluminum solder 51 and copper solder 52 are provided in this order.

On the top principal surface of the substrate 49, there are provided aluminum solder 59 and copper solder 60 in this order.

A resin mold 61 made of epoxy resin or the like is provided around the semiconductor substrate 49 and the supporting electrodes 45 and 54. Further, in order to prevent stress, which is generated by the thermal shrinkage of the resin mold 61 due to the hardening of the resin, from being applied to the glass layer 56, a buffer material 62 such as silicone rubber is provided on the glass layer 56.

The embodiment shown in FIG. 4 is different from the embodiments shown in FIGS. 1 and 3, in that the nickel film 58 is provided on the bottom principal surface of the semiconductor substrate 49.

When the semiconductor substrate 49 is soldered to the supporting electrode 45, some copper atoms of the copper solder 52 diffuse into the substrate 49 through the aluminum solder 51. The copper atoms in the semiconductor substrate 49 act as a sort of impurity, which is different from a donor or acceptor determining the conductivity type of the substrate 49. In other words, the copper atoms act as a lifetime killer. When a high reverse voltage is applied across the pn junction in the substrate 49, the lifetime killer produces a leakage current. When the leakage current is large, the substrate 49 cannot withstand the applied reverse voltage, and thus the breakdown is generated. That is, when the copper atoms diffuse into the substrate 49, the leakage current is increased and the breakdown voltage is lowered.

The nickel layer 58 serves as a shielding layer, which prevents the copper atoms from diffusing into the substrate 49 when the substrate 49 is soldered to the supporting electrode 45. Therefore, the breakdown voltage of the substrate 49 is not lowered.

The aluminum solder 51 adhere well to the nickel layer 58, and the nickel layer 58 is kept in ohmic contact with the semiconductor substrate 49. Accordingly, there is no problem with respect to the bonding between the aluminum solder 51 and the semiconductor substrate 49. Further, since the nickel layer 58 prevents the aluminum solder 51 from making immediate contact with the n-type layer 49*a*, a p-type layer is not formed in the n-type layer 49*a*.

The bonding between the aluminum solder 51 and the copper solder 52 and the bonding between the aluminum solder 59 and the copper solder 60 can be done at a low temperature. Accordingly, the semiconductor substrate is hardly affected by the above-mentioned bonding.

The layer 58 may be made of titanium, chromium, molybdenum, tungsten, or the like.

Radiators made of aluminum are pressed against the supporting electrodes 45 and 54, as explained in connection with the embodiment shown in FIG. 1.

As has been explained hereinbefore, according to the present invention, a semiconductor substrate can be bonded firmly to an electrode at a low temperature without increasing a forward voltage drop of the semiconductor substrate.

Further, though disk-type semiconductor devices have been shown in the embodiments discussed, the package for semiconductor devices is not limited to that of disk type, and other packages such as a stud mount type package, a glass mold package or a can-type hermetic package may be employed.

We claim:

1. A semiconductor device comprising:

a semiconductor substrate including at least one pn junction, an n-type semiconductor layer being exposed to a principal surface of said semiconductor substrate; and an electrode bonded to the principal surface of said semiconductor substrate with brazing solder, wherein said brazing solder is in contact with substantially the entire exposed principal surface of said semiconductor substrate to bond said entire exposed principal surface of said semiconductor substrate to said electrode and comprises aluminum solder and copper solder bonded in solid phase adhesion to each other, said aluminum solder containing aluminum as a main component thereof and being provided on the side of said semiconductor substrate, said copper solder being provided on the side of said electrode.

2. A semiconductor device according to claim 1, wherein said electrode is made of one material selected from a group consisting of molybdenum, tungsten, an alloy of iron and nickel, and a composite material including a copper matrix with carbon fibers embedded therein.

3. A semiconductor device according to claim 1, wherein said aluminum solder is made of one material selected from a group consisting of aluminum and an alloy of aluminum and silicon.

4. A semiconductor device according to claim 1, wherein both of a p-type semiconductor layer and said n-type semiconductor layer are exposed to the principal surface of said semiconductor substrate.

5. A semiconductor device according to claim 1, wherein the principal surface of said semiconductor substrate is provided with a metal layer made of one selected from a group consisting of nickel, titanium, chromium, molybdenum and tungsten, and wherein said aluminum solder is provided on said metal layer, said metal layer being of sufficient thickness to reduce diffusion from said copper solder into said principal surface of said semiconductor substrate during bonding of the aluminum solder and the copper solder to one another.

6. A semiconductor device comprising:

a semiconductor substrate including at least one pn junction, an n-type semiconductor layer being exposed to a principal surface of said semiconductor substrate; and an electrode bonded to the principal surface of said semiconductor substrate with brazing solder, wherein said brazing solder is in contact with substantially the entire exposed principal surface of said semiconductor substrate to bond said entire exposed principal surface of said semiconductor substrate to said electrode and comprises aluminum solder and copper solder which have been bonded to one another at a temperature which is sufficient to cause solid phase adhesion between the aluminum solder and the copper solder but which is less than an eutectic alloy temperature for the aluminum and copper solders, said aluminum solder containing aluminum as a main component thereof and being provided on the side of said semiconductor substrate, said copper solder being provided on the side of said electrode.

7. A semiconductor device according to claim 6, wherein said aluminum solder and said copper solder have been bonded to one another at a temperature of about 450° C. for about 30 minutes.

8. A semiconductor device comprising:

a semiconductor substrate including at least one pn junction, an n-type semiconductor layer being exposed to a principal surface of said semiconductor substrate and an electrode bonded to the principal surface of said semiconductor substrate with brazing solder comprised of aluminum solder and copper solder, said brazing solder being in contact with substantially the entire exposed principal surface of said semiconductor substrate to said electrode, said aluminum solder containing aluminum as a main component thereof and being provided on the side of said semiconductor substrate, said copper solder being provided on the side of said electrode, wherein, in order to reduce diffusion of the aluminum solder into said n-type semiconductor layer during bonding of said electrode to said principal surface of said substrate, said aluminum solder and said copper solder have been bonded to each other at a temperature which is sufficient to cause solid phase adhesion between them but which is less than the eutectic alloy temperature for the aluminum and copper solders.

9. A semiconductor device according to claim 8, wherein said aluminum solder and said copper solder have been bonded to one another at a temperature of about 450° C. for about 30 minutes.

10. A semiconductor device according to claim 1, wherein said electrode comprises a support electrode for said semiconductor substrate.

11. A semiconductor device according to claim 6, wherein said electrode comprises a support electrode for said semiconductor substrate.

12. A semiconductor device according to claim 8, wherein said electrode comprises a support electrode for said semiconductor substrate.

13. A semiconductor device according to claim 1, wherein said copper solder is substantially pure copper.

14. A semiconductor device according to claim 6, wherein said copper solder is substantially pure copper.

15. A semiconductor device according to claim 8, wherein said copper solder is substantially pure copper.

* * * * *